United States Patent
Kim et al.

(10) Patent No.: US 7,236,327 B2
(45) Date of Patent: Jun. 26, 2007

(54) INFORMATION STORAGE MEDIUM AND APPARATUS ADOPTING THE SAME

(75) Inventors: Sung-dong Kim, Seongman-si (KR); Seung-bum Hong, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/023,468

(22) Filed: Dec. 29, 2004

(65) Prior Publication Data

US 2005/0141350 A1    Jun. 30, 2005

(30) Foreign Application Priority Data

Dec. 31, 2003  (KR) ......................... 10-2003-101578

(51) Int. Cl.
*G11B 5/74*  (2006.01)
*G11B 5/82*  (2006.01)

(52) U.S. Cl. ...................... 360/131; 360/135; 428/611; 428/827

(58) Field of Classification Search ..................... None
See application file for complete search history.

(56) References Cited

U.S. PATENT DOCUMENTS

| | | | |
|---|---|---|---|
| 6,858,319 B2 * | 2/2005 | Yasui et al. | 428/611 |
| 2005/0225900 A1 | 10/2005 | Itoh | |
| 2006/0172116 A1 * | 8/2006 | Den et al. | 428/137 |
| 2006/0204794 A1 * | 9/2006 | Kikuchi et al. | 428/836.2 |

FOREIGN PATENT DOCUMENTS

| | | |
|---|---|---|
| JP | 64-13216 | 1/1989 |
| JP | 8-87702 | 4/1996 |
| JP | 11-224422 | 8/1999 |
| JP | 2000-215785 | 8/2000 |
| JP | 2002-175621 | 6/2002 |
| WO | WO 2004/084193 | 9/2004 |

* cited by examiner

*Primary Examiner*—Andrew L. Sniezek
(74) *Attorney, Agent, or Firm*—Sughrue Mion, PLLC

(57) ABSTRACT

An information storage medium and an apparatus adopting the information storage medium. The information storage medium includes: a substrate; a lower magnetic layer formed on the substrate; and an upper magnetic layer, the upper magnetic layer includes an alumina layer having cavities formed on the lower magnetic layer and a magnetic material that is formed in the cavities of the alumina layer, which magnetic material contacts the lower magnetic layer.

5 Claims, 5 Drawing Sheets

LOW RESISTANCE

Al₂O₃   15 nm φ quantum hole

← OUTPUT SIGNAL 1  0  1

INFORMATION STORAGE MEDIUM AND APPARATUS ADOPTING THE SAME

BACKGROUND OF THE INVENTION

This application claims the priority of Korean Patent Application No. 2003-101578, filed on Dec. 31, 2003, in the Korean Intellectual Property Office, the disclosure of which is incorporated herein in its entirety by reference.

1. Field of the Invention

The present invention relates to an information storage medium in which a nano-sized contact is formed between magnetic materials and an information recording and/or reproducing apparatus adopting the information storage medium.

2. Description of the Related Art

In an information reproduction method using magneto-resistance (MR), a MR head approaches a magnetic disc to detect variations in resistance of the MR head with respect to variations in magnetic field of the magnetic disc.

Giant MR (GMR) is known to exhibit a resistance variation of about 10% due to a variation in magnetic field. As an example, GMR is applied to a hard disc drive (HDD). As shown in FIG. 1, an information head 10 used in a GMR HDD has a structure in which lower and upper magnetic layers 12 and 14 are stacked on a substrate 11 and a non-magnetic layer 13 is interposed between the lower and upper magnetic layers 12 and 14. As shown in FIG. 2A, when the magnetization directions of the lower and upper magnetic layers 12 and 14 are parallel, the stack presents a low resistance. As shown in FIG. 2B, when the magnetization directions of the lower and upper magnetic layers 12 and 14 are anti(non)-parallel, the stack presents a high resistance. It is known that a GMR HDD reproduction head using a method of reproducing information depending on whether the magnetization directions of the lower and upper magnetic layers 12 and 14 are parallel or anti-parallel provides a recording density of about 100 Gb/in$^2$.

Tunneling Magneto-Resistance (TMR) is mainly applied to a magnetic random access memory (MRAM), and exhibits a maximum resistance variation of about 50% and a recording density of about 300 Gb/in$^2$.

An information storage medium, which is compact and contains a larger amount of information, is necessary for processing various kinds and enormous amounts of information. However, a GMR or TMR information reproduction method fails to satisfy the present technical requirements for such an information storage medium. Moreover, in the GMR or TMR information reproduction method, a metallic multi-layer thin film is used and has a complicated stack structure. Thus, there is a demand for a simple and high density information reproduction method and storage medium.

SUMMARY OF THE INVENTION

It is therefore an object of the present invention to provide an information storage medium having greatly improved recording density and an information recording and/or reproducing apparatus adopting the information storage medium.

The above object has been achieved in accordance with a first aspect of the present invention by providing an information storage medium including: a substrate; a lower magnetic layer formed on the substrate; and an upper magnetic layer which includes an alumina layer comprising cavities formed on the lower magnetic layer and a magnetic material formed in the cavities of the alumina layer, which magnetic material contacts the lower magnetic layer.

According to another aspect, the present invention, provides an information recording and/or reproducing apparatus including: an information storage medium including lower and upper magnetic layers; and a head which includes a probe that moves relative to the information storage medium and that contacts the information storage medium. The information storage medium includes: a substrate; a lower magnetic layer formed on the substrate; and an upper magnetic layer which includes an alumina layer comprising cavities formed on the lower magnetic layer and a magnetic material formed in the cavities, which magnetic material contacts the lower magnetic layer.

In the information recording and/or reproducing apparatus, the information storage medium preferably comprises a rotating disc which is fixed by a spindle of a rotating apparatus, and the head is installed so as to move relative to the rotating disc from the center of the rotating disc toward a perimeter direction of the rotating disc.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
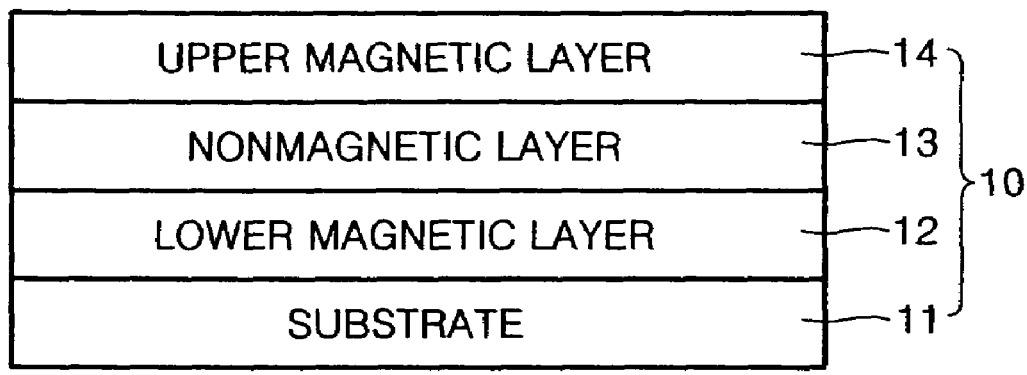
FIG. 1 is a schematic cross-sectional view of a conventional information storage read head.
Figure 2A:
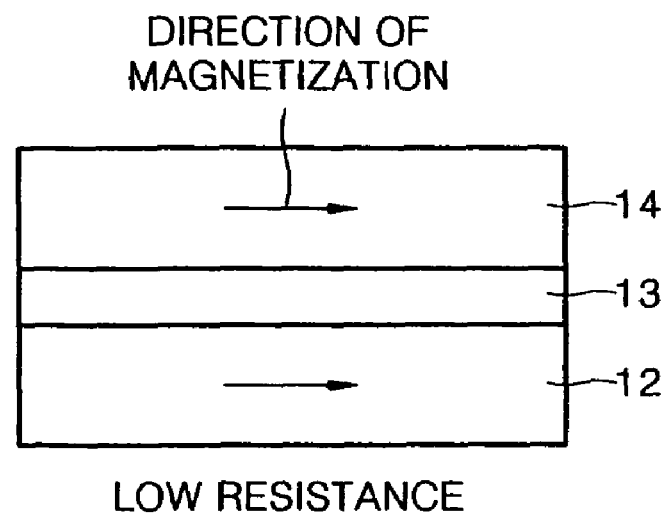
FIGS. 2A and 2B are views which explain a method of reading information in the information storage read head of FIG. 1.
Figure 2B:
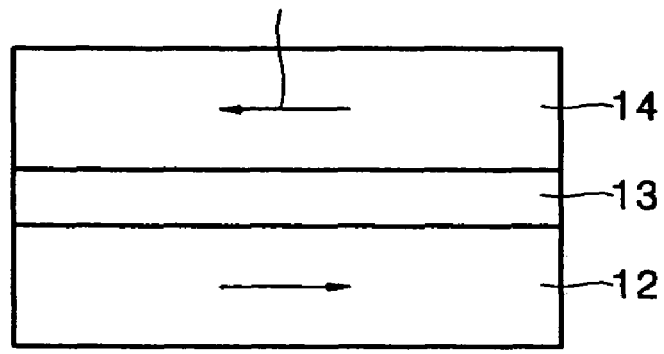
Figure 3:
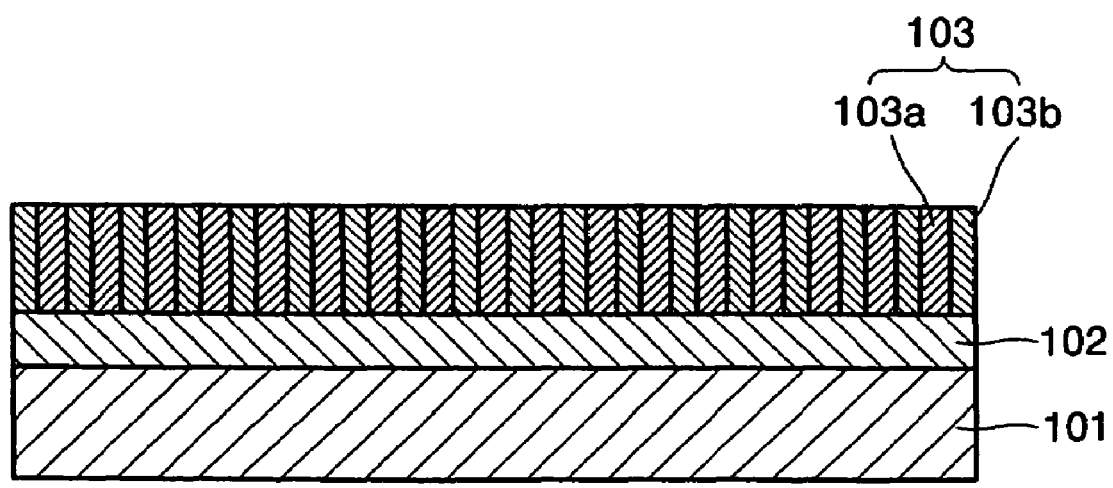
FIG. 3 is a schematic cross-sectional view illustrating a stack structure of an information storage medium, according to an embodiment of the present invention.

Referring to FIG. 3, in an information storage medium according to the present invention, lower and upper magnetic layers 102 and 103 are stacked on an insulating or conductive substrate 101. The lower magnetic layer 102 is magnetized in a fixed direction, for example, vertically to or parallel with the insulating or conductive substrate 101. The upper magnetic layer 103 is a characteristic part of the present invention and includes pits, which are naturally formed during anodizing of Al. In other words, the upper magnetic layer 103 includes an aluminum oxide ($Al_2O_3$) thin film 103a, i.e., an alumina thin film, and a magnetic material 103b filling cavities formed in the alumina thin film. Here, the cavities are formed at interfaces among alumina grains in a systematic order when aluminum is oxidized to form aluminum oxide.

Figure 4:
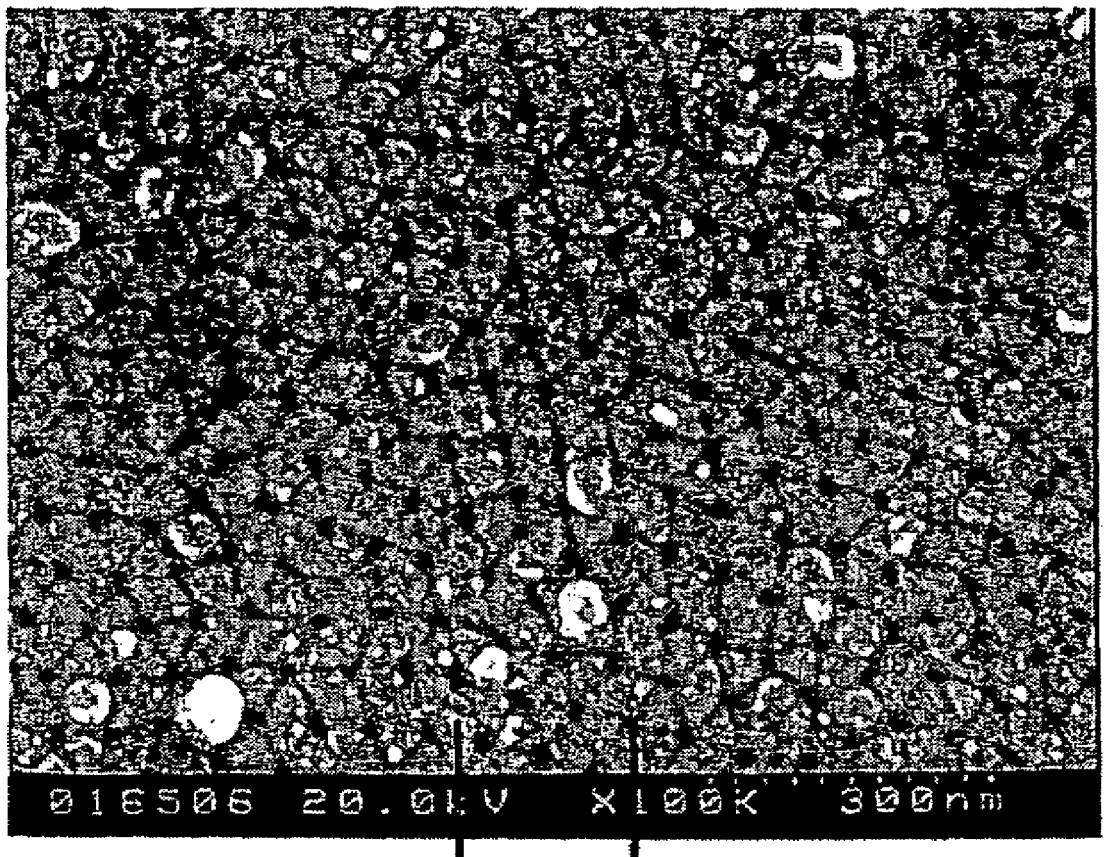
FIG. 4 is a scanning electron microscope (SEM) photo showing the surface of alumina applied to the information storage medium of the present invention.

FIG. 4 is an SEM photo showing a crystal structure of alumina. As shown in FIG. 4, interfaces are formed among alumina grains, and nano-sized holes having a diameter of 15 nm are formed at the interfaces among the alumina grains. Such holes, i.e., cavities, allow a nano-sized contact to be formed between a lower magnetic layer and a magnetic material in the cavities. Thus, an area through which electrons pass without dispersing is formed.

In other words, the information storage medium of the present invention uses nano-sized empty holes formed during anodizing of an aluminum layer as unit information recording elements, i.e., pits.

Figure 5:
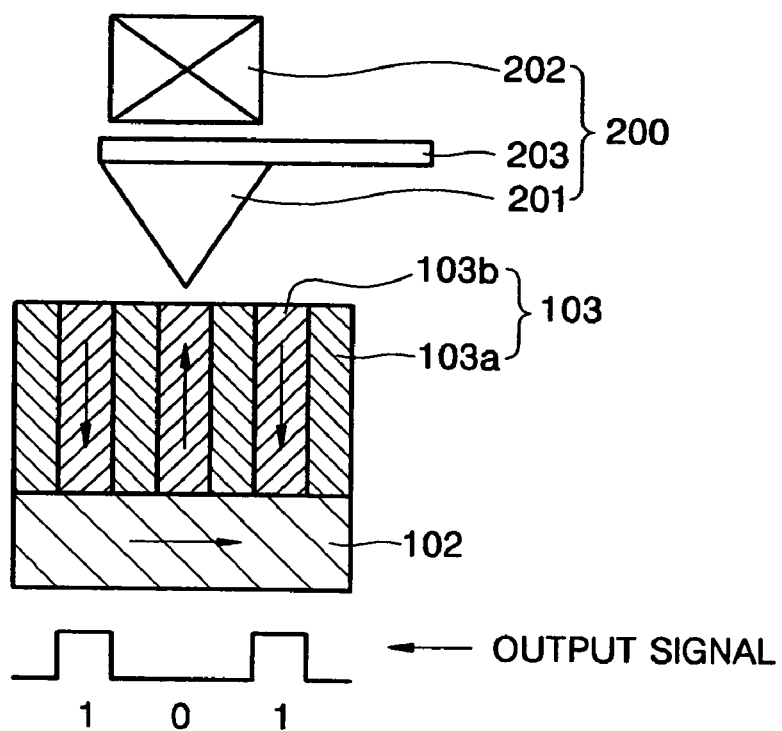
FIG. 5 is a view showing a schematic structure of an information recording and/or reproducing apparatus, according to an embodiment of the present invention.

FIG. 5 is a view for showing a schematic structure of an information recording and/or reproducing apparatus of the present invention and explains a method of reproducing information from the information storage medium of the present invention.

The information recording and/or reproducing apparatus includes a head 200 which moves relative to an information storage medium 100. The head 200 includes a probe 201 mounted on armature 203 which contacts the information storage medium 100 and serves as an information detector and a magnetic recorder 202 which generates a magnetic field for information recording.

When the probe 201 contacts the upper magnetic layer 103, an electric resistance difference occurs due to a difference between a magnetization direction of a magnetic material of the upper magnetic layer 103 and a magnetization direction of the lower magnetic layer 102. Thus, a predetermined voltage is applied between the probe 201 and the information storage medium 100, and thus a current variation occurs. Such a current variation is detected as binary information of high and low signals and used for information reproduction. Recording of information is achieved by the magnetic recorder 202 over the probe 201.

Figure 6:
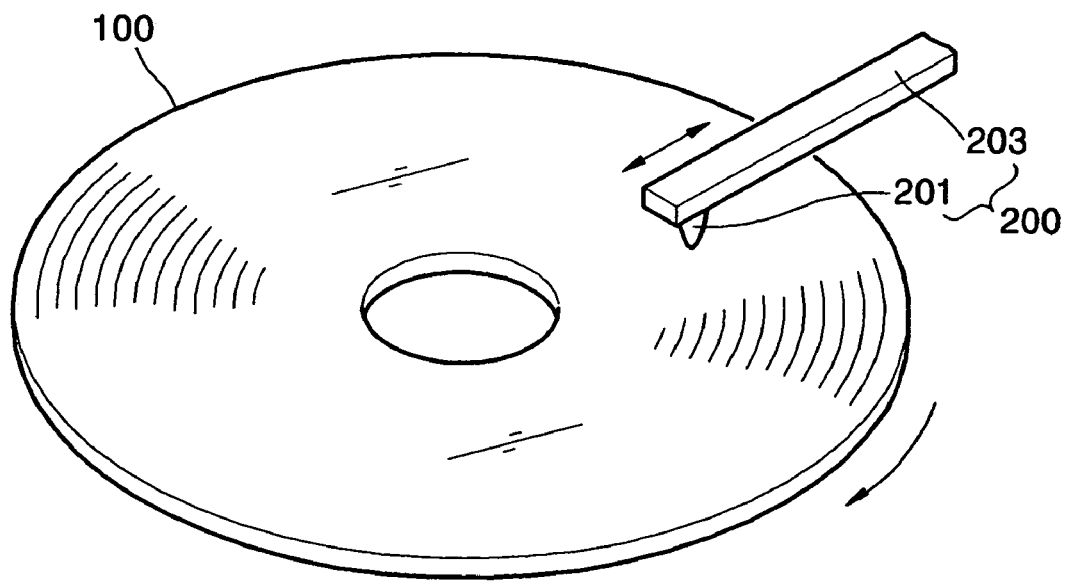
FIG. 6 is a view showing the schematic structure of the information recording and/or reproducing apparatus adopting a rotary information storage medium.

The information storage medium 100 and the head 200 may have structures as in a general HDD. In other words, as shown in FIG. 6, the information storage medium 100 may be a rotating disc, and the head 200 may have a structure such that a swing arm (not shown) moves the head 200 from the center of the rotating disc radially outward. Meanwhile, the head 200 may have a structure which moves with respect to the information storage medium 100 via a general x-y stage.

FIGS. 7A through 7D are schematic cross-sectional views which explain a process of manufacturing an information storage medium, according to an embodiment of the present invention.

Figure 7A:
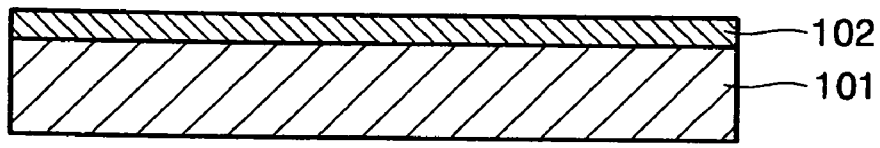
FIGS. 7A through 7D are schematic cross-sectional views which explain a process of manufacturing an information storage medium, according to an embodiment of the present invention.

As shown in FIG. 7A, a lower magnetic layer 102 is formed on a conductive or insulating substrate 101 formed of a hard material. The lower magnetic layer 102 may be formed of FeCo or the like using a deposition method or a plating method.

Figure 7B:
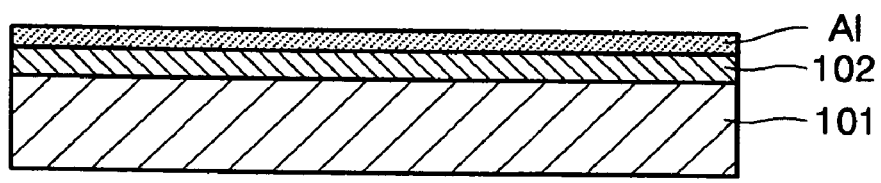

As shown in FIG. 7B, aluminum (Al) is deposited on the lower magnetic layer 102.

Figure 7C:
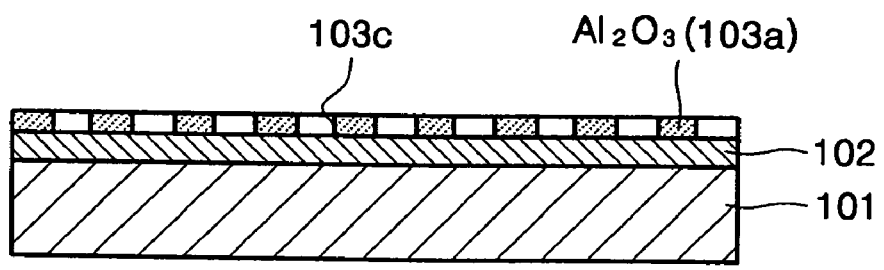

As shown in FIG. 7C, the Al is oxidized using an acid solution or the like to form an aluminum oxide ($Al_2O_3$) layer 103a. Then, minute holes or cavities 103c are obtained. Here, when the Al is sufficiently oxidized, the cavities 103c expand to expose the lower magnetic layer 102.

Figure 7D:
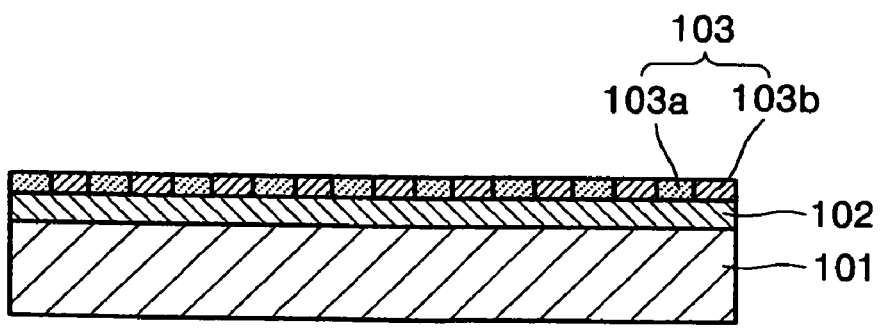

As shown in FIG. 7D, the cavities 103c are filled with a magnetic material 103b, so that the surface of the magnetic material 103b matches with the surface of the $Al_2O_3$ layer 103a. In other words, the cavities 103c are filled with the magnetic material 103b using a plating method or a sputtering method. If necessary, a polishing process is performed to make the surfaces of the magnetic material 103b and the $Al_2O_3$ layer 103a smooth.

As described above, in an information storage medium and an apparatus adopting the information storage medium, according to the present invention, in order to use a MR effect, a lower magnetic layer can be formed on the entire surface of a substrate. Cavities formed in alumina on the lower magnetic layer can be filled with an upper magnetic material. Thus, a nano-sized contact can be formed between the lower magnetic layer and the upper magnetic material. Such a minute contact between lower and upper magnetic materials contribute to forming an area through which electrons pass without dispersing so as to exhibit a large difference in resistance of more than several hundred %.

According to the present invention, a Tb-level (trillobyte level) information storage medium and an apparatus adopting the Tb-level information storage medium can be obtained. Such a Tb-level information storage medium can accommodate an extremely expanding amount of information and be applied to an HDD, an MRAM (magnetic random-access memory), and the like.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An information storage medium comprising:
 a substrate;
 a lower magnetic layer formed on the substrate, the lower magnetic layer magnetized in a fixed direction; and
 an upper magnetic layer which comprises (i) an alumina layer comprising cavities formed on the lower magnetic layer, and (ii) a magnetic material formed in the cavities of the alumina layer, which magnetic material directly contacts the lower magnetic layer through nano-sized contacts.

2. An information recording and/or reproducing apparatus comprising:
 an information storage medium comprising lower and upper magnetic layers; and
 a head which comprises a probe that moves relative to the information storage medium and that contacts the information storage medium,
 wherein the information storage medium comprises:
 a substrate;
 a lower magnetic layer formed on the substrate; and
 an upper magnetic layer which comprises (i) an alumina layer comprising cavities formed on the lower magnetic layer, and (ii) a magnetic material formed in the cavities of the alumina layer, which magnetic material directly contacts the lower magnetic layer, wherein the probe detects an electrical resistance difference occurring due to a difference between a magnetization direction of the upper magnetic layer and a magnetization direction of the lower magnetic layer.

3. The information recording and/or reproducing apparatus as claimed in claim 2, wherein the information storage medium comprises a rotating disc, and the head moves relative to the rotating disc.

4. The information recording and/or reproducing apparatus as claimed in claim 2, wherein the head moves relative to the information storage medium in an x-y direction.

5. The information recording and/or reproducing apparatus as claimed in claim 2, wherein the lower magnetic layer is magnetized in a fixed direction.

* * * * *